(12) United States Patent
Baylav et al.

(10) Patent No.: US 12,230,577 B2
(45) Date of Patent: Feb. 18, 2025

(54) LOCAL DENSITY CONTROL FOR METAL CAPACITANCE REDUCTION

(71) Applicant: Intel Corporation, Santa Clara, CA (US)

(72) Inventors: Burak Baylav, Hillsboro, OR (US); Dhananjay Bhawe, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 649 days.

(21) Appl. No.: 17/358,947

(22) Filed: Jun. 25, 2021

(65) Prior Publication Data

US 2022/0415812 A1 Dec. 29, 2022

(51) Int. Cl.
*H01L 23/538* (2006.01)
*G06F 30/392* (2020.01)
*H01L 23/522* (2006.01)

(52) U.S. Cl.
CPC ........ *H01L 23/5386* (2013.01); *G06F 30/392* (2020.01); *H01L 23/5222* (2013.01)

(58) Field of Classification Search
CPC .................... H01L 23/5386; H01L 23/528
See application file for complete search history.

(56) References Cited

U.S. PATENT DOCUMENTS

| | | | |
|---|---|---|---|
| 2004/0088669 A1* | 5/2004 | Loh | G06F 30/39 257/773 |
| 2018/0174895 A1* | 6/2018 | Licausi | H01L 23/53257 |
| 2020/0111746 A1* | 4/2020 | Inoue | H01L 21/76865 |

FOREIGN PATENT DOCUMENTS

| | | | | |
|---|---|---|---|---|
| CN | 112447670 A | * | 3/2021 | ....... H01L 21/76816 |
| JP | 2000277615 | | 10/2000 | |
| JP | 2003078015 A | * | 3/2003 | ......... H01L 21/7682 |
| JP | 2011049246 | | 3/2011 | |
| KR | 20070082445 A | * | 8/2007 | ........... H01L 23/528 |
| WO | WO-2006095655 A1 | * | 9/2006 | ....... H01L 21/31053 |

OTHER PUBLICATIONS

Extended European Search Report from European Patent Application No. 22165560.8 notified Oct. 11, 2022, 9 pgs.
Notice of Allowance from European Patent Application No. 22165560.8 notified Jan. 24, 2024, 8 pgs.

* cited by examiner

*Primary Examiner* — Evren Seven
(74) *Attorney, Agent, or Firm* — Essential Patents Group, LLP

(57) ABSTRACT

An integrated circuit structure includes a plurality of interconnect lines and a plurality of dummy lines that are co-planar with the plurality of interconnect lines, where a ratio of line length to end-to-end spacing of the dummy lines varies inversely with a density of the interconnect lines within each of a plurality of regions. The regions are of approximately equal area within a rectangular grid array.

15 Claims, 11 Drawing Sheets

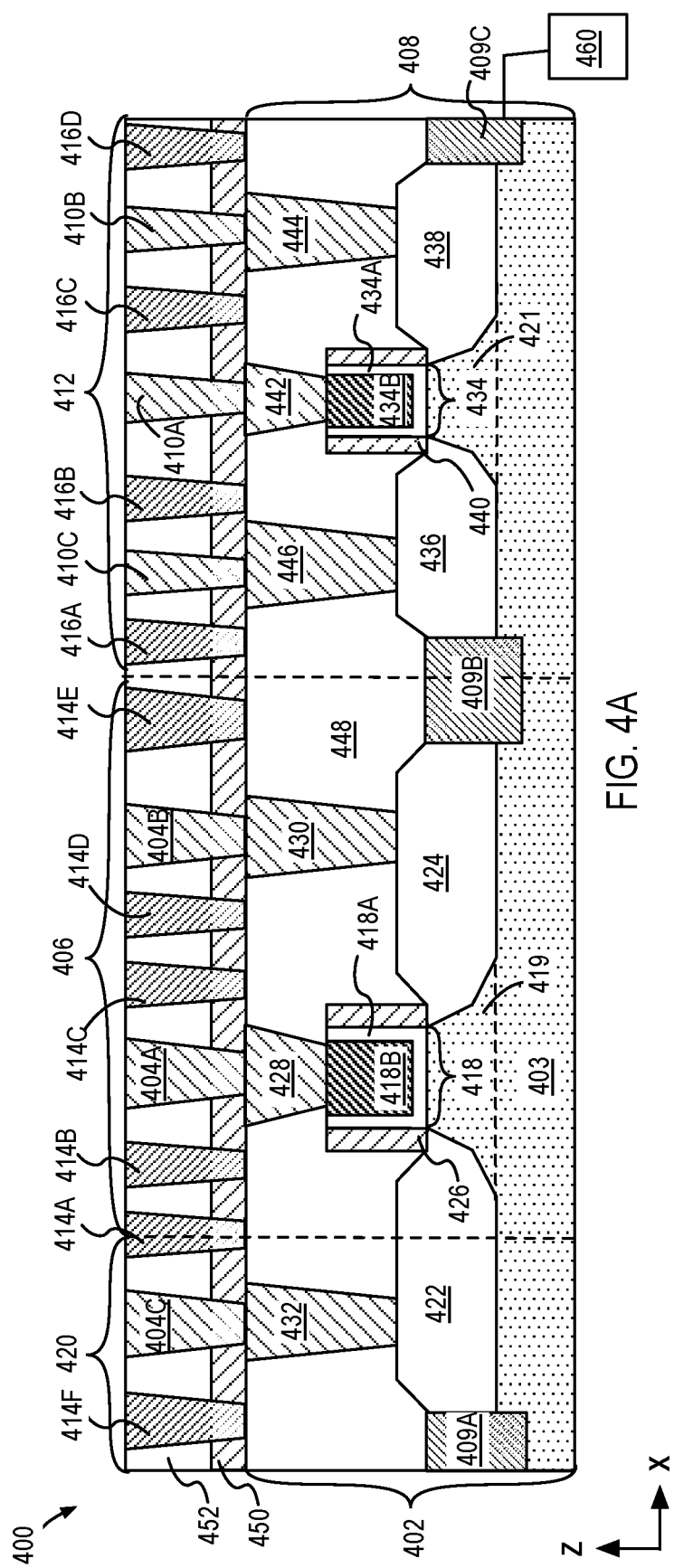
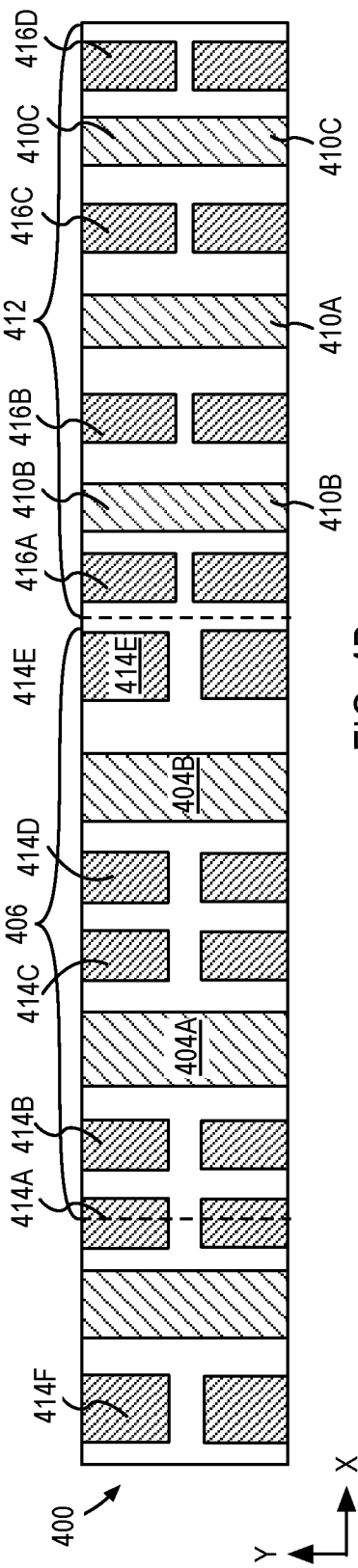
FIG. 4A
FIG. 4B

LOCAL DENSITY CONTROL FOR METAL CAPACITANCE REDUCTION

BACKGROUND

Generally, interconnect structures in integrated circuit structure blocks include some amount of excess metal to mitigate metal density concerns for fabrication. Such "excess metal" can be in the form of either dummy, floating metal lines or redundant line end extensions of an electrical network. Redundant line end extensions, for example, can cause RC delays in circuits. However, arbitrary removal of excess metal lines can cause significant process issues. Thus, there is a need to find a balance between electrical impact and fabrication process limitations through local density control of excess metal lines.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 4A is a cross-sectional illustration of a plurality interconnect lines and a plurality of dummy lines over a first and a second region, where some of the plurality interconnect lines in the first region are coupled with a first transistor, and some of the interconnect lines in the second region are coupled with a second transistor, in accordance with an embodiment of the present disclosure.

FIG. 4B is a plan-view illustration of the structure in FIG. 4A, where a first plurality interconnect lines are over a first transistor in the first region and a second first plurality of interconnect lines is over a second transistor in the second region.

DETAILED DESCRIPTION

Figure 1A:
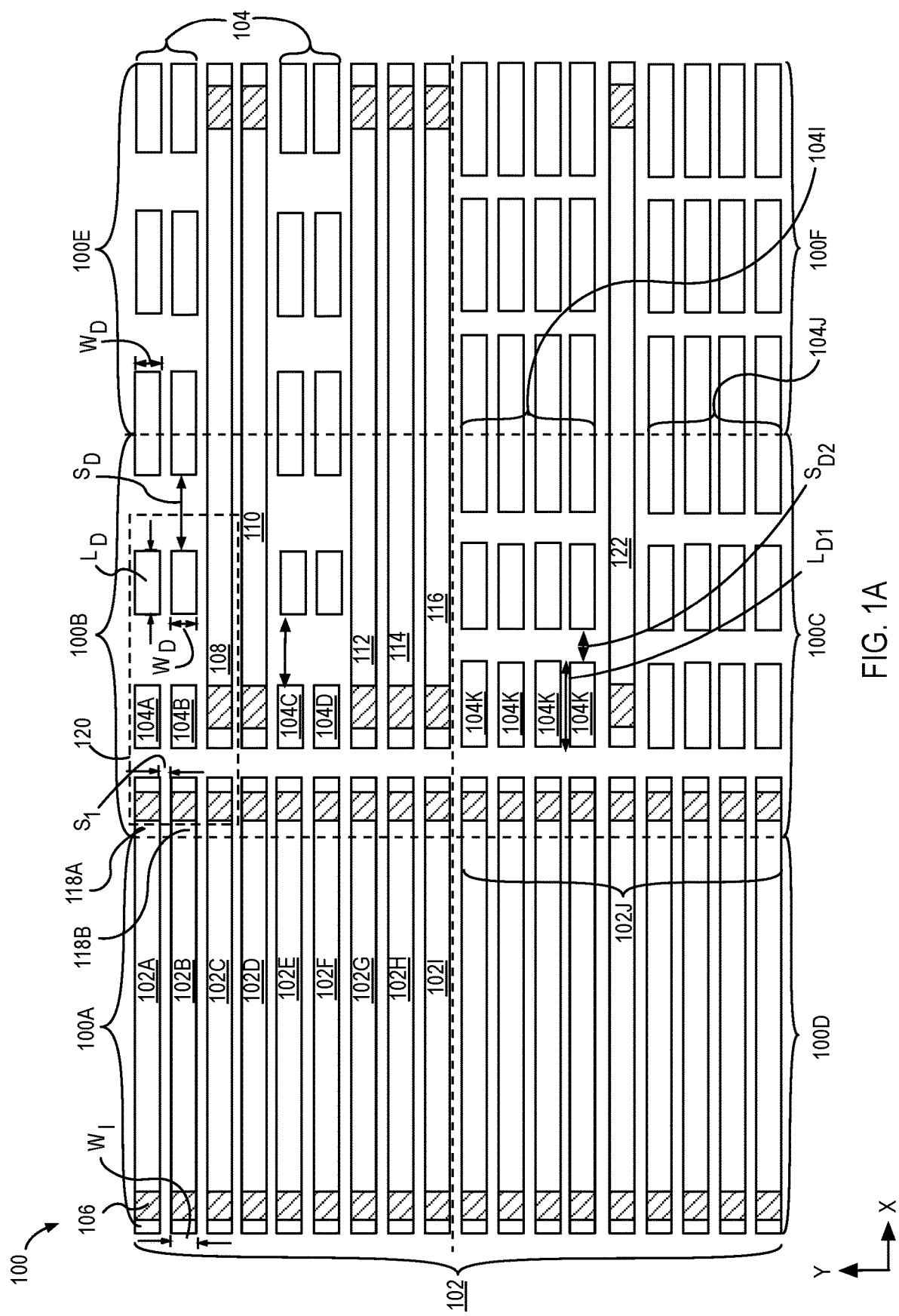
FIG. 1A is plan-view illustration of an integrated circuit structure including a plurality of interconnect lines and a plurality of dummy lines in various regions in a gridded array, in accordance with an embodiment of the present disclosure.

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

A density control method for capacitance reduction during mask design is described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In integrated circuit structure blocks such as in interconnect levels, designers include some amount of excess metal to mitigate metal density concerns. Such "excess metal" can be in the form of either dummification structures, floating metal lines or redundant line end extensions on the outermost vias of an electrical network. However, excess metal lines can result in more than a required number of structures to be present. While it is desirable for only the active metal structures to be included in an integrated circuit design in any level of the circuitry, dummification metal lines (dummification lines) are included within a given level of the circuitry to preserve a requisite minimum density of structures. The requisite density of structures is typically required for fabrication considerations such as for patterning and planarization process operations. Planarization processes, for example, are particularly susceptible to structural layout and density of the integrated circuit design. A planarization process such as a chemical mechanical planarization (CMP) process can cause preferential dishing or excess removal of material (metal lines or interlayer dielectric adjacent to the metal lines) depending on design and local density of lines. One design technique is to include some amount of excess metal around the circuitry to prevent dishing that can damage metal lines and create structures with non-uniform heights. However, excess metal lines, for example can cause degradation in circuit performance such as RC delay. A balance between minimizing RC delay and preventing structural degradation is desirable for complex integrated circuit operation and manufacturability.

The inventors have devised a method to analyze circuit layout during a post-tapein phase, or mask design phase. Because of the complexities arising from a vast number of diverse components of a microprocessor circuitry, it is desirable to address metal density issues and to find global solution for an entire chip on a given level (an interconnect level, for example). A post-tapein approach to analyze circuit layout for possible capacitance reduction paths via removal of excess metals may provide a faster path to incorporate any learnings from fabrication.

The method involves dividing an active circuit region into approximately equal regions and analyzing each region independently to determine line density inside them. Each region includes essential metal lines, i.e., active metal sections interacting with vias needed for the desired circuitry. However, because of underlying circuit layout (on a level below), the layout of active metal lines is not necessarily uniform (varying line density) across the active circuit region. Thus, each region includes varying densities of essential metal lines, where line density refers to a product of the length and width of all essential metal lines divided by an area of the region of interest. The method identifies essential metal lines and defines requisite metal line lengths to minimize capacitance. However, while it is desirable to remove all non-essential (or redundant) metal lines to reduce parasitic capacitance, it is essential to leave some portions of non-essential metal lines for defect-free fabrication requirements. The analysis process to determine how much non-essential metal lines to leave within a given layout is driven by process operations utilized to fabricate a given interconnect level. Redundant parts of the metal lines are grouped together and then divided into a plurality of smaller dummy metal structures (dummy structures) within a given region. Depending on regions, the dummy structures can be of given length and spaced apart by a distance that is greater than, less than or equal to the length of the dummy structures. For each region, the analysis process calculates essential line density amounts and then computes a minimum non-essential line density requirement to meet the overall minimum line density requirement within that region. The line density of the dummy structures is also given by a product of the length and width of all dummy structures within a given region divided by an area of the region. A ratio of the length of the dummy structures to the spacing between end to end of two dummy structures is related to the neighboring essential metal density and required min overall line density. In general, the analysis results in mask layout where the density of dummy structures have a low density in the vicinity of high-density essential metal lines and a high density where the density of essential metal lines is low. In some embodiments, a first region includes only essential or active metal lines and an adjacent second region includes essential metal lines and dummy structures.

The method to compute the line density and design layout of dummy structures to have a combination of length and space can be implemented at each layer of the interconnect structure. Thus, each region within each interconnect layer can be independently analyzed, where line lengths of and spacing between dummy structures can be tuned to cater to specific processes in the fabrication process.

FIG. 1A is plan-view illustration of an integrated circuit structure 100 including a plurality of interconnect lines 102 and a plurality of dummy lines 104 that are co-planar with the plurality of interconnect lines 102, in accordance with an embodiment of the present disclosure. Generally, a ratio of line length, $L_D$, to end-to-end spacing, $S_D$, between laterally spaced dummy lines 104, varies inversely with a density of the interconnect lines 102 within each of a plurality of regions 100A, 100B etc. Each region 100A, 100B etc. is of approximately equal area within a rectangular grid array.

In the illustrative embodiment, region 100A includes a plurality of interconnect lines 102A, 102B, . . . 102I. In the illustrative embodiment, the region 100A does not include any dummification structures. As illustrated in the enhanced plan view illustration of FIG. 1B, individual ones of the interconnect lines 102A, 102B, etc each have an interconnect length, $L_I$ measured along a longitudinal direction (x-axis) and a width, $W_I$ measured along the y-axis. As shown interconnect lines 102A, 102B, etc are separated by a spacing, $S_I$ that is measured orthogonal to the longitudinal direction. The density of the interconnect lines in region 100A is defined by a product of the interconnect length, $L_I$, and width, $W_I$ of all interconnect lines 102A, 102B, etc. within region 100A, divided by an area, AG, of region 100A. As shown, the area, AG of region 100A is given by a product of length, $L_G$ and width, $W_G$, where $L_G$ and $W_G$, are respectively length and width of the region 100A in the rectangular grid array. In general, the density of interconnect lines in a given region is dependent on the number of lines, width, $W_I$ and spacing, $S_I$, between adjacent interconnect lines (for example, between interconnect lines 102A and 102B). Similarly, dummy lines 104A, 104B etc each have a width, $W_D$ and a dummy line length, $L_D$ measured along the x-direction. The density of the dummy lines 104A, 104B etc is a product of the dummy line length $L_D$ and the width $W_D$ of all dummy lines within region 100A, divided by an area, AG, of region 100A. The total density of interconnect lines and dummy lines in all regions 100A, 100B etc are computed identically.

In some embodiments, the density of interconnect lines in region 100A, is greater than 50% but less than 80% when a spacing between lines $S_I$ is less than $W_I$, and less than 50% when $S_I$ is greater than $W_I$. In various embodiments, the density of the interconnect lines in the individual ones of the plurality of regions 100A, 100B etc is between 10% and 80%. While interconnect lines 102A, 102B etc have a substantially same width, $W_I$ and are spaced apart by a same spacing, $S_I$, in general, $W_I$ does not need to be the same for each interconnect line 102A, 102B, etc. Furthermore, $S_I$, does not need to be the same between any two adjacent interconnect lines, such as, for example interconnect lines 102A and 102B, etc.

Referring again to FIG. 1A, in the illustrative embodiment, region 100B is adjacent to region 100A and includes a plurality of interconnect lines 108, 110, 112, 114 and 116 and a plurality of dummification lines 104A, 104B, 104C, 104D, etc. In the illustrative embodiment, the region 100B further includes end portions such as portions 118A, 118B etc of the interconnect lines 102A, 102B, etc. The plurality of interconnect lines 108, 110, 112, 114 and 116 have a line density that is defined in a same manner as line density above. In the illustrative embodiment, a combined line density of all interconnect lines 108, 110, 112, 114 and 116 and end portions of the interconnect lines 102A, 102B is less than a line density of interconnect lines 102A, 102B, etc in region 100A.

Region 100B has a same or substantially the same area as region 100A. In the illustrative embodiment, interconnect lines 110, 112 etc. are longitudinally aligned with some of the plurality of interconnect lines 102. For example, interconnect lines 108 and 110 are aligned with interconnect lines 102C and 102D, respectively and interconnect lines 112, 114 and 116 are aligned with interconnect lines 102G, 102H and 102I, respectively. As shown, individual ones of a plurality of dummy lines 104A, 104B etch are longitudinally aligned with some of the plurality of interconnect lines 102. For example, dummification lines 104A, 104B, 104C and 104D are longitudinally aligned interconnect lines 102A, 102B, 102E and 102F respectively. In the illustrative embodiment, one end of each the dummification lines 104A, 104B 104C and 104D are further aligned with an end of interconnect lines 108, 110, 112, 114 or 116 along the y-axis. In some embodiments, the density of interconnect lines (including end portions of the interconnect lines 102A, 102B, etc) in region 100B is greater than 50% but less than 60% when a spacing between lines $S_I$ is less than $W_I$, and less than 50% when $S_I$ is greater than $W_I$.

Figure 1C:
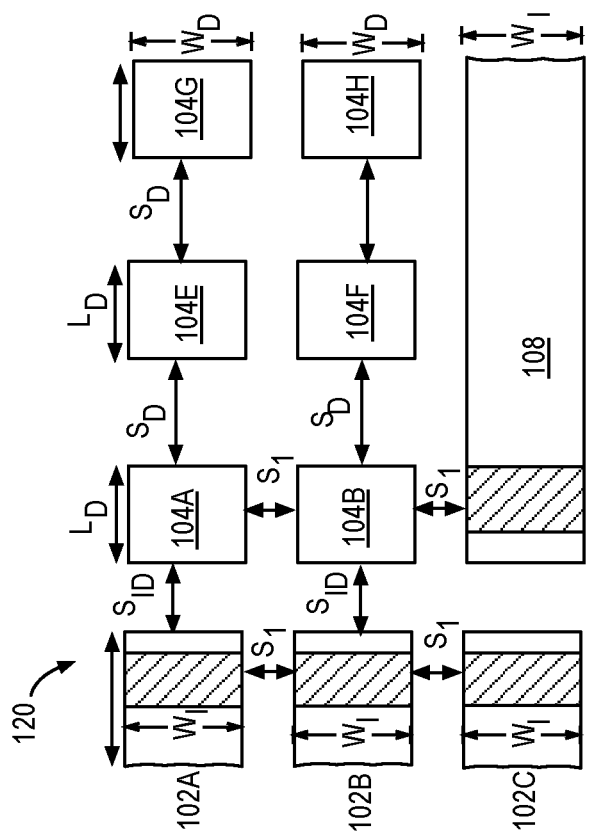
FIG. 1C is an enhanced plan-view illustration of a portion of a second region in the gridded array of the integrated circuit structure of FIG. 1A.
Figure 1B:
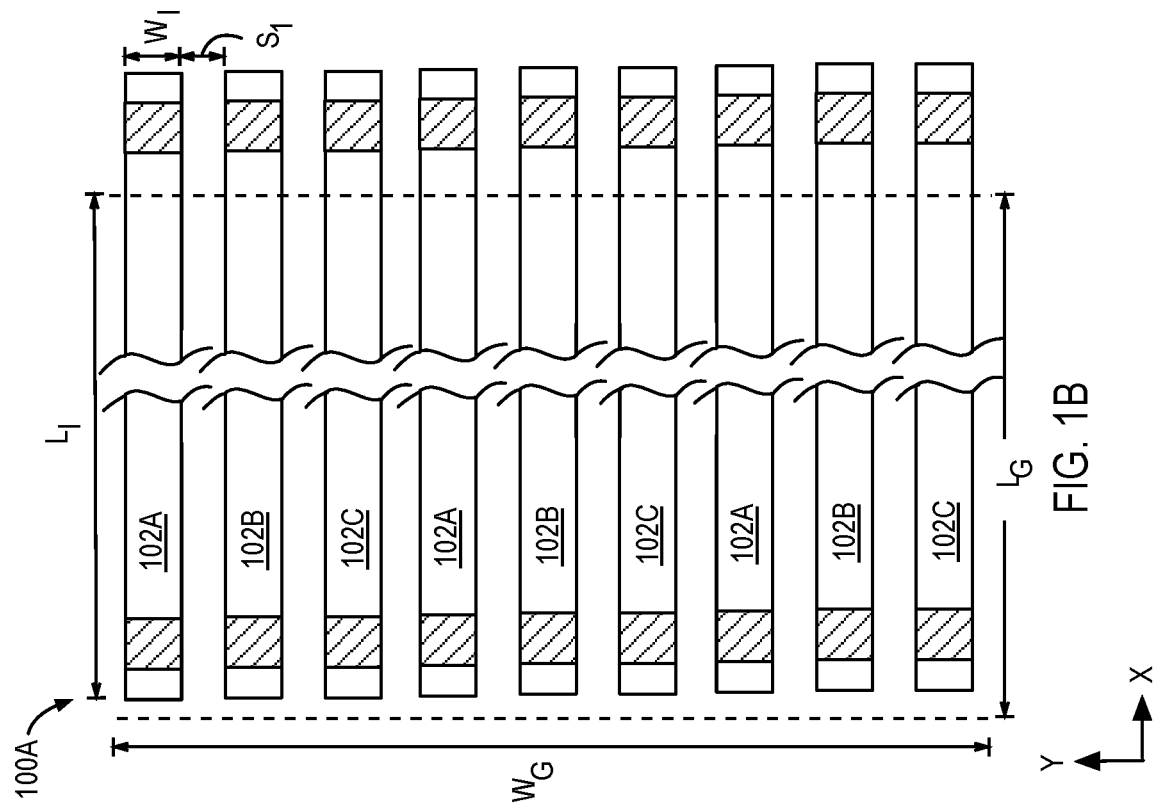
FIG. 1B is an enhanced plan-view illustration of a portion of a first region in the gridded array of the integrated circuit structure of FIG. 1A.

FIG. 1C is an enhanced plan view illustration of a portion 120 of the region 100B. As shown dummification lines 104A, 104B are separated from interconnect lines 104A and 104B by a spacing Sm. The dummification lines 104A, 104B, 104E and 104F each have a line length $L_D$. Laterally adjacent dummification lines, for example 104A, 104E and 104G or 104B, 104F and 104H, are laterally separated by a distance, $S_D$, (along the x-axis), as shown. The ratio of $L_D$:$S_D$ can vary from between less than 1:1 to greater than 1:1 depending on a dummification line density required. In some embodiments, $S_{ID}$ is different from $S_D$. In other embodiments, $S_{ID}$ is approximately equal to $S_D$. In general, Sm also plays an important role in determining the overall density of lines in region 120 (and in region 100B).

The dummification lines 104A, 104B each have a width $W_D$ and end portions of the interconnect lines 102A, 102B and 102C for example have a width, $W_I$, as discussed above. While $W_D$ does not, in general, have to equal to $W_I$, in the illustrative embodiment, $W_D$ is equal to $W_I$. Examples where $W_D$ is equal to $W_I$ and where interconnect lines (for example 102A and 102B) are longitudinally aligned with dummification lines (for example, 104A and 104B, respectively), are representative of exemplary embodiments where dummification lines are fabricated by dissecting interconnect lines. In general, all dummification lines extending along the x-axis, in the Figure, are longitudinally aligned. Dummification lines for example dummification lines 104A and 104B do not need to be necessarily aligned along the y-axis in the Figure. However, in exemplary embodiments, dummification lines 104A and 104B or 104E and 104F are aligned along the y-axis or orthogonal to the longitudinal direction.

In the illustrative embodiment, the dummification lines 104A and 104B, 104E and 104F, and 104G and 104H are separated along the y-direction by a spacing $S_I$. A uniform spacing, S 1, such as is shown, may be indicative of a design technique utilized.

Referring again to FIG. 1A, integrated circuit structure 100 also includes a region 100C directly below and adjacent to region 100B. A shown region 100C includes end portions of interconnect line structures 102J from a laterally adjacent region 100D. The region 100C includes interconnect lines having a density that is less than an interconnect line density of region 100B. In the illustrative embodiment, a single interconnect line 122 is positioned between a plurality of dummification lines 104I and plurality of dummification lines 104J. Region 100C has one or more properties of the region 100B described above. For example, the individual ones of dummification lines in plurality of dummification structures 104I have a line length, $L_{D1}$. As shown, the spacing between laterally adjacent dummification lines have a spacing $S_{D2}$. The dummification lines in region 100C have a ratio of line length, $L_{D1}$, to end-to-end spacing, $S_{D2}$, that is greater than 1:1. As shown, ratio of $L_{D1}$ to $S_{D2}$ is approximately 2:1. A higher ratio of $L_{D1}$ to $S_{D2}$ in region 100C correlates inversely with the lower density of interconnect lines in the region 100C. In the illustrative embodiment, one end of dummification lines 104K, within the plurality of dummification lines 104I, are aligned with an end of an interconnect line 122 along the y-axis.

In the illustrative embodiments, end portions of a plurality of interconnect lines 102J and the interconnect line 122 have a combined line density that is less than a line density of the interconnect lines in region 100B or in region 100A. In the illustrative embodiment, the interconnect line density in region 100A is higher than in all other regions. In some embodiments, the interconnect line densities in other regions are between 10%-100% of the interconnect line density in region 100A. In the illustrative embodiment, the interconnect line density in region 100C is less than 90% of the interconnect line density in region 100A and less than 80% of the interconnect line density in region 100B.

It is desirable to have, a combined line density of all interconnect lines and dummification lines in a given region to be within 30% of a maximum possible combined line density of all interconnect lines and dummification lines. Furthermore, in the illustrative embodiment, a combined line density of all interconnect lines and dummification lines in region 100B or in region 100C is within 30% of the overall line density of all interconnect lines and dummification lines in region 100A or 100D.

Additionally, desirable to have a combined line density of all interconnect lines and dummification lines in a given region to be within 10% of a combined line density of all interconnect lines and dummification lines in a given region that does not have a maximum combined line density. For example, in the illustrative embodiment, region 100A has a maximum combined line density and regions 100B and 100C do not. In some such embodiments, a combined line density of all interconnect lines and dummification lines in region 100B is within 10% of the combined line density of all interconnect lines and dummification lines in region 100C.

Region 100E includes interconnect lines and dummification lines that have one or more properties of the interconnect lines and dummification lines in region 100B. Region 100F includes interconnect lines and dummification lines that have one or more properties of the interconnect lines and dummification lines in region 100C.

In the illustrative embodiment, individual ones of the plurality of interconnect lines 102 in region 100A, interconnect lines 110, 112, 114, 116 and end portions of interconnect lines 102 in region 100B, interconnect line 122 and end portions of interconnect lines 102J in region 100C, and individual ones of the plurality of interconnect lines 102J in region 100D each comprise at least one via. Depending on dimensions of the interconnect lines and dimensions of regions 100A-F, some of the interconnect lines can have two vias coupled in one or more region such as in or more regions 100A-F.

Figure 2:
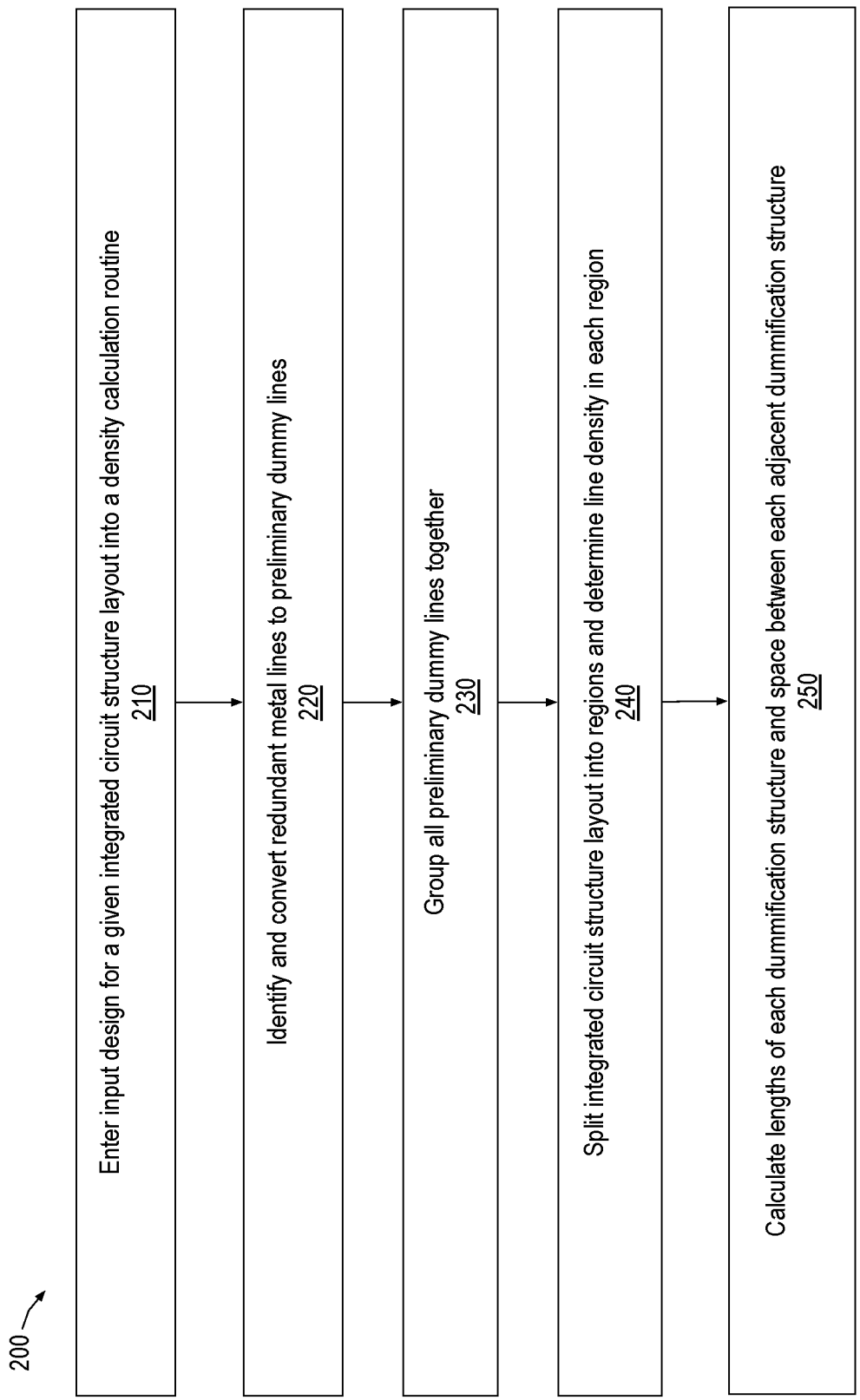
FIG. 2 is a flow diagram illustrating a method to control density of dummy lines across the various regions in the gridded array.

FIG. 2 is a method 200 to calculate density of interconnect lines and dummy structures using a density calculation routine. The method 200 begins at operation 210 by entering an input design for a given integrated circuit structure layout into a density calculation routine. The method continues at operation 220 by identifying and converting redundant metal lines to preliminary dummy structures. The method continues at operation 230 by grouping all preliminary non-active line structures. Non-active lines are not electrically connected to other circuit elements. The method continues at operation 240 by splitting the integrated circuit structure layout into regions and determining a line density in each region. The method 200 concludes at operation 250 with calculating lengths of each dummification structure and space between each dummification structure based on a minimum density requirement.

Figure 3A:
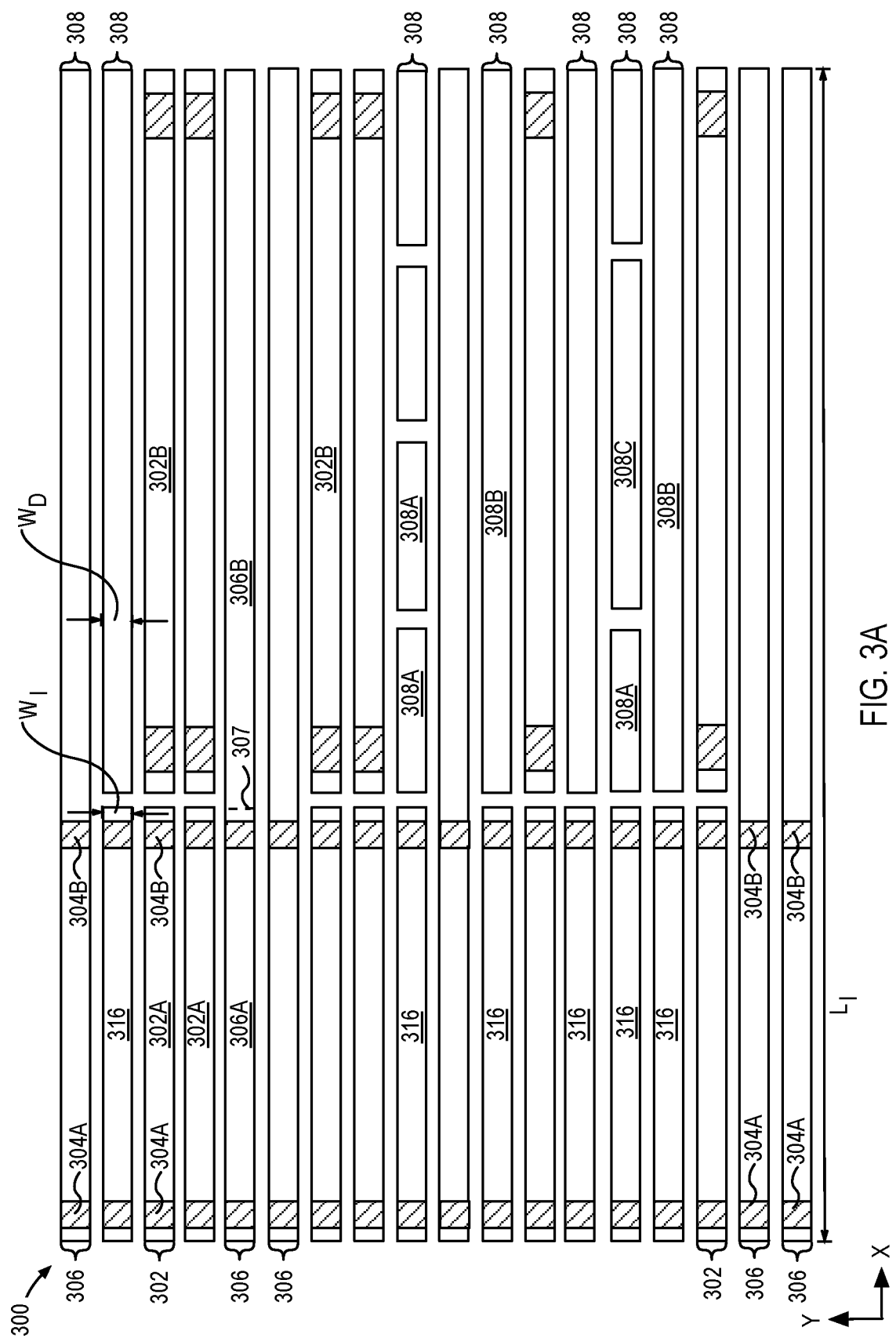
FIG. 3A is a plan view illustration of a post-tape-in integrated circuit structure layout following the process to input a design for an integrated circuit structure layout into a local density calculation program.

FIG. 3A is a plan view illustration of an integrated circuit structure layout 300 following the process to input a design for an integrated circuit structure layout into a density calculation program. The integrated circuit structure layout 300 includes a plurality of metal lines having a variety of different features. For example, the layout 300 includes one or more active metal lines such as line 302 that has one at least two vias 304A and 304B, where each via 304A and 304B are coupled to opposite ends of the line 302. The vias 304A and 304B are not in the same plane as the plane of the line 302 but are represented in FIG. 3A to illustrate which lines are active metal lines, i.e., lines which are connected to electrical circuitry. In the illustrative embodiment, line 302 includes a line segment 302A and separate a line segment 302B longitudinally aligned to line segment 302A, where line 302A is shorter than line 302B. Each of the line segments 302A and 302B include a respective pair of vias 304A and 304B.

The layout 300 further includes one or more active metal lines such as lines 306 that extend along an entire length, $L_I$, of the layout 300, where the lines 306 includes essential metal portions 306A (line 306A) and non-essential metal portions 306B (separated by dashed lines 307). Lines 306 each have a pair of vias 304A and 304B, where via 304A is at an end of each of the lines 306, and where a via 304B is part way along each of the lines 306 but not at the end.

The layout 300 also includes plurality of dummification lines 308, where individual dummification lines 308A, 308B, 308C etc. may be of varying lengths. In some embodiments, the plurality of dummification lines 308 is included in the layout 300 and supplanted with more dummification lines after the density calculation process.

The layout 300 further includes one or more active metal lines such as line 316 that has one at least two vias 304A and 304B, where the line 316 is separated from a single dummification line 308B or multiple dummification lines 308A, or a combination of one or more dummification lines 308A and of one or more dummification lines 308C.

It is to be appreciated that each type of metal line 302, 306, 316 or dummification line 308 has a same or substantially the same width, $W_D$. Having a same or same or substantially the same width, $W_D$ can facilitate calculation of line densities and design lengths of non-essential metal (dummification) lines and determine spacing between the non-essential metal lines. In other embodiments, $W_D$ may be different among the different metal lines and dummification line.

Figure 3B:
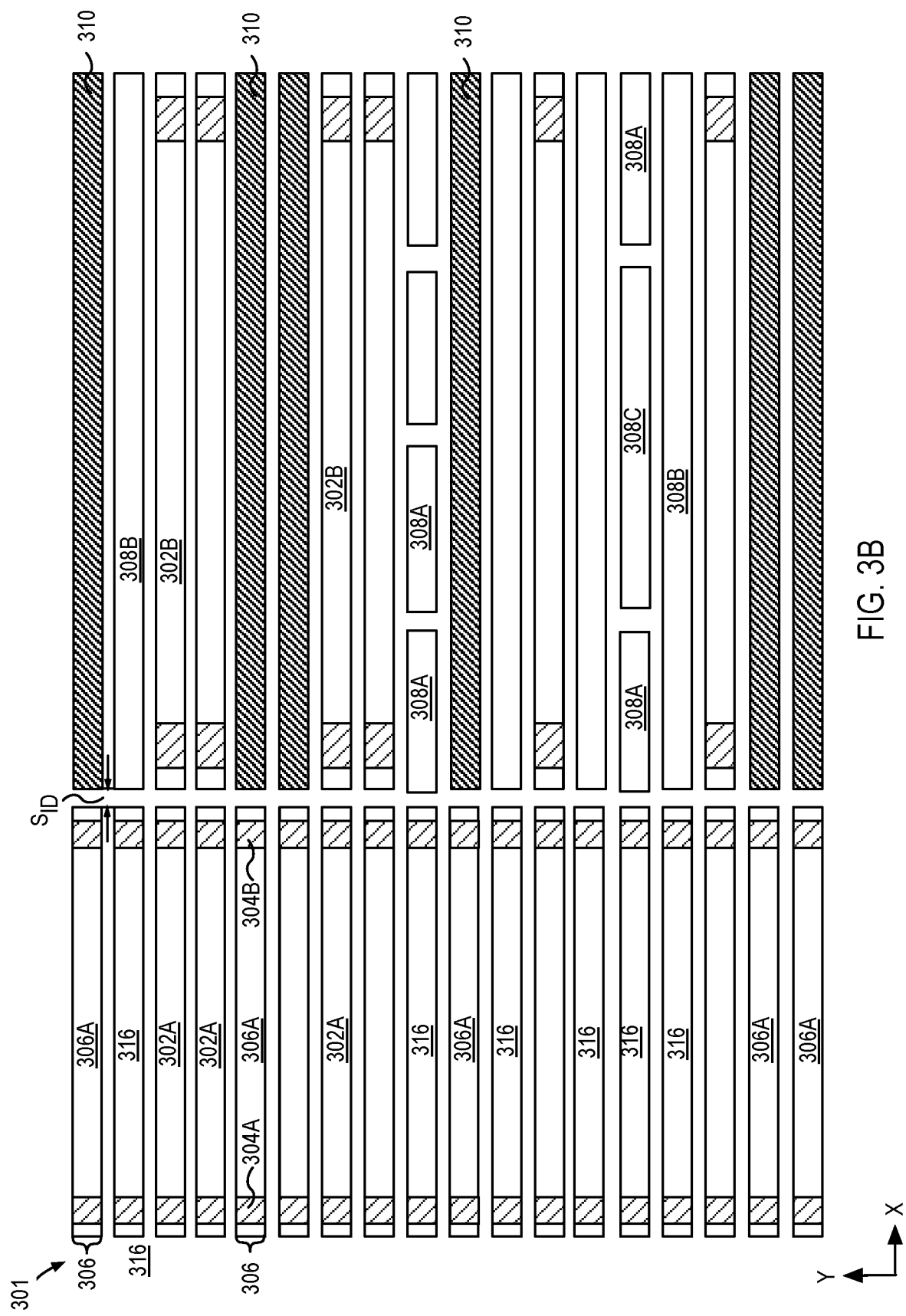
FIG. 3B is a plan view illustration of the layout in FIG. 3A following a process to cleave a redundant portion of some of the active metal lines.

FIG. 3B is a plan view illustration of a layout 301 following a process to cleave a redundant portion of some of the active metal lines. In the illustrative embodiment, each line 306 is cleaved to isolate line 306A which retains vias 304A and 304B. A separate line segment 310 is formed from a previously existing portion 306B (see FIG. 3A). In an embodiment, line 306A is laterally separated from line segment 310 by a spacing, $S_{ID}$. A small lateral portion of line 306 between line segment 310 and line 306A in the spacing, $S_{ID}$ is removed to physically and electrically isolate line 306A from line segment 310. The resulting line segment 310 is a non-essential metal line. Segmenting line segment 310 from line 306A can cause line capacitance to be reduced. Line segment 310 may be further divided after calculation of line density of active and dummification lines to design appropriate dummification lines. In the illustrative embodiment, each essential line 302A is laterally separated from an adjacent essential metal line such as line 302B, and each essential line 316 is laterally separated from an adjacent single or plurality of longitudinally spaced dummification lines by a spacing $S_{ID}$. In embodiments, upper and lower bounds of $S_{ID}$ can come from patterning or an integrated patterning process which can set limits for minimum and maximum defect free end-to-end values for a particular layer. In some embodiments, minimum $S_{ID}$ corresponds to minimum allowed end-to-end for a particular metal layer, and maximum $S_{ID}$ corresponds to maximum defect free end-to-end.

Figure 3C:
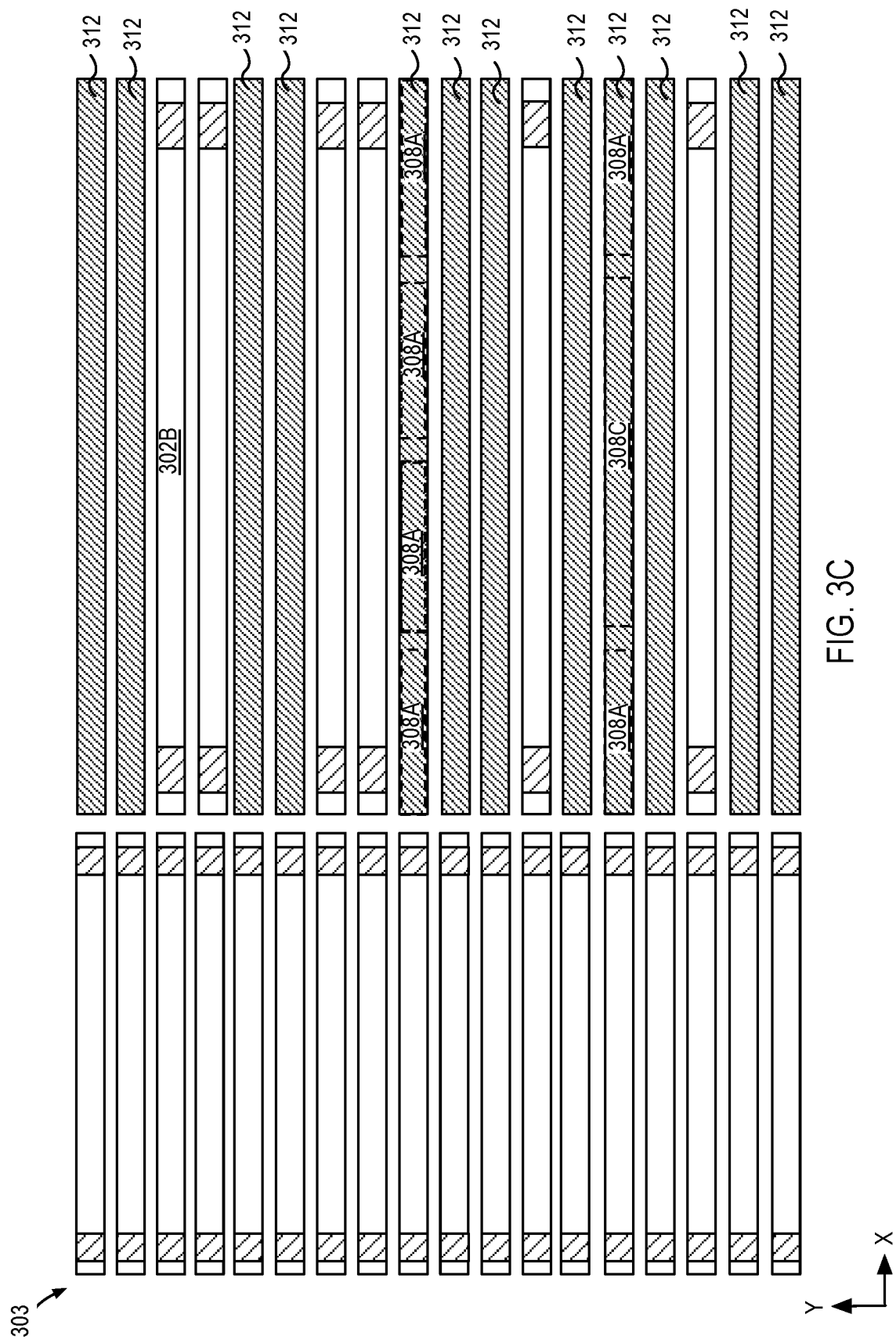
FIG. 3C is a plan view illustration of the layout in FIG. 3B following a process to group all redundant metal lines from the previous operation and two or more laterally adjacent dummification lines, in accordance with an embodiment of the present disclosure.

FIG. 3C is a plan view illustration of a layout 303 following a process to group (or a grouping phase of) all non-essential metal lines from the previous operation and two or more laterally adjacent dummification lines. Once the lines are grouped together, after a density calculation, the grouped lines are split into smaller dummy lines as will be discussed below. The grouping phase results in creation of single lines that are approximately a length of line segment 302B. In the illustrative embodiment, the plurality of laterally adjacent dummification lines 308A are grouped together to form a non-active line 312. As shown, laterally adjacent dummification lines 308A, 308C are also grouped together to also form a non-active line 312. At the grouping phase, all previously existing single dummification lines, such as dummification lines 308B (in FIG. 3B) that are not laterally adjacent to other dummification lines are also identified as non-active lines 312 for potential splitting.

Figure 3D:
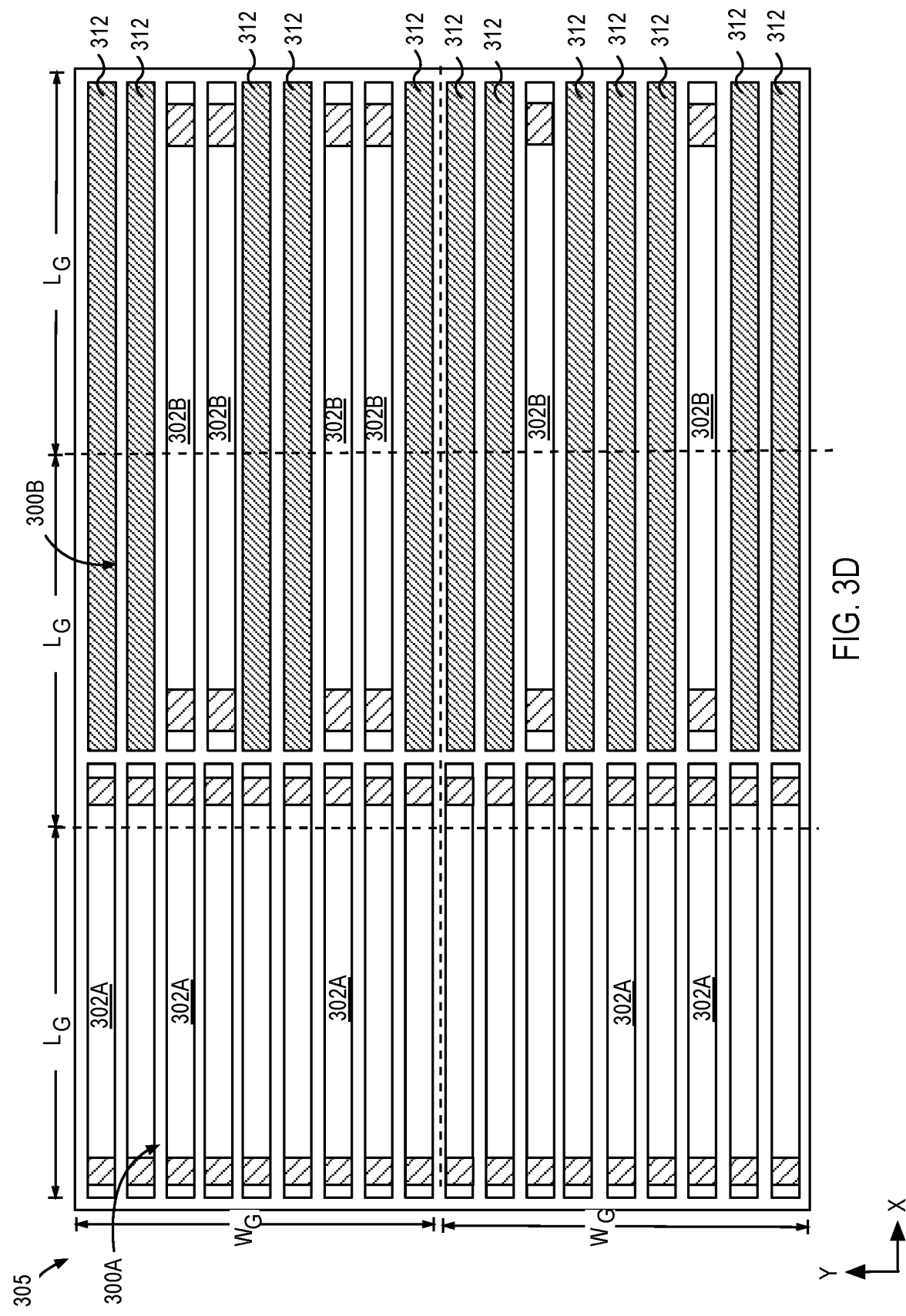
FIG. 3D is a plan view illustration of a layout following a process to divide the integrated circuit structure layout into equal number of regions.

FIG. 3D is a plan view illustration of a layout 305 following a process to divide the integrated circuit structure layout 303 into equal number of regions to form a rectangular grid array. In the illustrative embodiment, the layout 303 is divided into 6 regions, 300A, 300B, 300C, 300D, 300E and 300F, where each of the regions 300A, 300B, 300C, 300D, 300E and 300F, have a same or substantially a same area. The area of each region 300A, 300B etc. is given by a product of the length, $L_G$, and width, $W_G$, as discussed above. In some embodiments, the area of regions 300A, 300B etc. are between 1 square micron to 40 square microns. The area of each region 300A, 300B etc. can be varied as needed and may not necessarily align with any of the lines, as illustrated. For example, as is shown, the region 300A includes only lines 302A and no dummification lines and region 300B includes end portions of lines 302A well as non-active lines 312.

The non-active lines 312 in each region 300A, 300B, 300C, 300D, 300E and 300F are divided to yield a dummification pattern with a specific dummification line density. Line density of essential metals (active circuitry) or lines 302A and 302B and line density of all non-active lines 312 is calculated in each region. The line density of lines 302A and 302B and combined non-active lines 312 in each window is a product of a line length of each line 302A and/or 302B, and line length of the line 312 in a given region divided by the area of the region. It is to be appreciated that a same or substantially the same line width (along the y-direction), of lines 302A, 302B and lines 312, can facilitate the computation of total line density within each region. However, such a constraint is not generally required for method to work. The density computation provides different line densities in each region 300A, 300B, etc. Once density computations are complete the non-essential lines will be replaced by dummification lines illustrated in FIG. 1A. Referring again to FIG. 3D, the dummification lines will have a specific line length and a spacing between laterally adjacent dummification lines. Depending on the magnitude of active interconnect line density of each region 300A, 300B, etc. a numerical ratio of a dummification line length to end-end spacing between adjacent dummification lines assigned to each region. The numerical ratio is utilized to dissect the non-active lines 312 by determining an overall length of each dummification lines and spacing between each line in a given region. For example, in region 300B, a 1:1 numerical ratio may be assigned. A numerical ratio of 1:1 indicates that the dummification lines in the region 300B may have a dummification line length that is equal to a spacing between the dummification lines. It is to be appreciated that in a region where density of lines 302A and/or 302B is high, the ratio of dummification line length to end-end spacing is lower and vice versa.

Figure 3E:
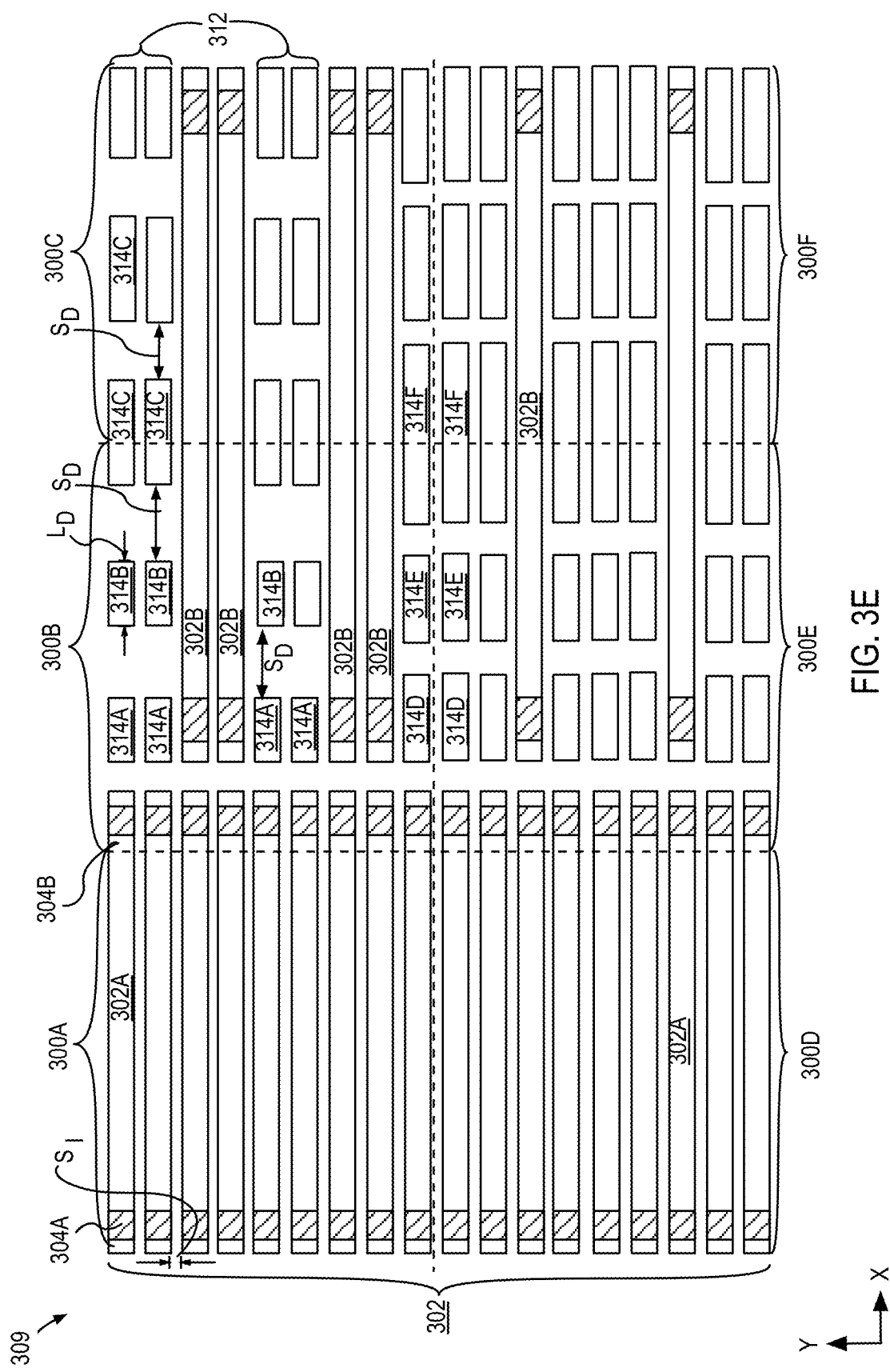
FIG. 3E is a plan-view illustration of the layout in FIG. 3D following the process to compute a line length to end-end spacing ratio and replacing non-essential lines with dummification lines, in accordance with an embodiment of the present disclosure.

FIG. 3E is a plan-view illustration of a layout 300E following the process to compute a line length to end-end spacing ratio and replacing the non-essential lines with dummification lines, in accordance with an embodiment of the present disclosure. The layout 300E is substantially similar to layout 100 described in association with FIG. 1A. Referring again to FIG. 3E, in the illustrative embodiment, the non-active lines 312 are converted to dummification lines 314A, 314B and 314C in region 300B. In the illustrative embodiment, 314A and 314B have a line length to end-end spacing, $L_D:S_D$ that is approximately 1:1. Dummification lines 314C partially straddles region 300B and region 300E. Dummification lines 314C have a length that is greater than length of dummification lines 314B because line density of active lines 302B is less in region 300C. Subsequently, spacing $S_D$ in region 300C is less than $S_D$ in region 300B.

In some embodiments, such as is shown region 300E has a lower density of active lines 302B than in region 300B. In the illustrative embodiment, a combined line density of dummification lines 314D, 314E and 314F in region 300E is greater than a line density of combined dummification lines 314A, 314B, 314C, 314D, 314E and 314F in region 300B. Generally, the dummification line density from one region to another is between 0% to 90%, i.e., essential metal line density is such that there are no dummification lines or a 0% dummification line density, to a minimum required metal density or for example 100% dummification lines.

The resultant dummification lines in layout 309 is one example of manipulation of non-essential lines to yield resultant dummification structures. The resultant layout of dummification lines is dependent on the type of dummification density required for a particular process operation at a given level. However, the computation for determining line length and spacing requirements is equally applicable across different layout designs at all levels of a microchip.

FIG. 4A illustrates a system 400 which includes a plurality of transistors where a transistor 402 is coupled with interconnect lines 404A, 404B and 404C in a region 406 and a transistor 408 is coupled with interconnect lines 410A and 410B in a region 412. The system 400 further includes system 400 a plurality of dummy or dummification lines 414A, 414B, 414C, 414D and 414E that are co-planar with the plurality of interconnect lines 404A, and 404B in region 406. As shown, a plurality of dummy or dummification lines 416A, 416B, 416C and 416D are co-planar with the plurality of interconnect lines 410A, 410B and 410C that are coupled with various terminals of transistor 408 in region 412.

As shown in the plan-view illustration of FIG. 4B, ratio of line length to end-to-end spacing of the dummification lines 414A, 414B, 414C, 414D, 414E and 414F, and ratio of line length to end-to-end spacing of the dummification lines 416A, 416B, 416C and 416D varies inversely with a density of the interconnect lines within each of the regions 406 and 412, respectively. Regions 406 and 412 have approximately equal area within a rectangular grid array, as shown. Interconnect lines 404A, 404B, 410A, 410B and 410C have one or more features of the interconnect lines 102A, 102B, 108 etc. and dummification lines 414A, 414B, 414C, 414D, 414E and 414F have one or more features of the dummification lines 104A, 104B etc (described in association with FIGS. 1A and 1C). In the illustrative embodiment, interconnect lines 404A, 404B have a different lateral width compared to a lateral width of interconnect lines 410A, 410B and 410C. While the line density of dummification lines in regions 406 and 412 are comparable in the illustrative embodiment, region 406 includes two interconnects 404A and 404B while region 412 includes three interconnects 410A, 410B and 410C. In general, an overall line density of dummification lines and interconnect lines are comparable between regions 406 and 412.

Referring again to FIG. 4A, in an embodiment, the transistor 402 is on a substrate 403 and includes a gate 418 on a channel 419, a source region 422, and a drain region 424. In the illustrative embodiment, various isolation portions 409A and 409B are on portions of the substrate 403, adjacent to the source region 422 and adjacent to the drain region 424. In some implementations of the disclosure, such as is shown, a pair of sidewall spacers 426 are on opposing sides of the gate 418. The transistor 402 also includes gate dielectric layer 418A on the substrate 403 and a gate electrode 418B adjacent to the gate dielectric layer 418A. The transistor 402 further includes a gate contact 428 above and electrically coupled to the gate 418, and a drain contact 430 above and electrically coupled to the drain region 424, and a source contact 432 above and electrically coupled to the source region 422, as is illustrated in FIG. 4A.

Gate contact 428 and source contact 432 are each coupled with interconnects. In the illustrative embodiment, gate contact 428 is coupled with a gate interconnect 404A, drain contact 430 is coupled with drain interconnect 404B and the source contact 432 is coupled with a source interconnect 404C in region 420. In the illustrative embodiment, a portion of region 420 is shown. Region 420 has a substantially the same length $L_I$ as regions 406 and 412. As shown, dummification line 414A has portions in each region 406 and 420. The region 420 further includes a dummification line 414F.

In the illustrative embodiment, the transistor 408 is on a portion of substrate 403 and includes a gate 434 on a channel 421, a source region 436, and a drain region 438. In the illustrative embodiment, isolation portion 409B is on a portion of the substrate 403, adjacent to the source region 436 and isolation portion 409C is adjacent to the drain region 438. In some implementations of the disclosure, such as is shown, a pair of sidewall spacers 440 are on opposing sides of the gate 434. The transistor 402 also includes gate dielectric layer 434A on the channel 421 and a gate electrode 434B adjacent to the gate dielectric layer 434A. The transistor 408 further includes a gate contact 442 above and electrically coupled to the gate 434, and a drain contact 444 above and electrically coupled to the drain region 438, and a source contact 446 above and electrically coupled to the source region 436, as is illustrated in FIG. 4A.

Gate contact 442, drain contact 444 and source contact 446 are each coupled with interconnects. In the illustrative embodiment, gate contact 442 is coupled with a gate interconnect 410A, drain contact 444 is coupled with drain interconnect 410B and the source contact 446 is coupled with a source interconnect 410C.

A dielectric 448 is adjacent to various contacts and spacers in regions 406 and 412. In the illustrative embodiment, dielectric 448 is adjacent to source regions 422 and 436, source contacts 432 and 446, spacers 426 and 440, portions of the gate 418 and 434, gate contacts 428 and 442, drain contacts 430 and 444, drain regions 424 and 438 and isolation portions 409A, 409B and 409C. The dielectric 448 is also directly below dummification lines 414A, 414B, 414C, 414D, 414E, 414F, 416A, 416B, 416C, and 416D. An etch stop layer 450 including a silicon, and one or more of nitrogen, oxygen or carbon is directly on the dielectric 448. In the illustrative embodiment, dummification lines 414A, 414B, 414C, 414D, 414E, 414F, 416A, 416B, 416C, and 416D and interconnect lines 404A, 404B, 404C, 410A, 410B and 410C are directly adjacent to the etch stop layer 450. The system 400 further includes a dielectric 452 on the etch stop layer 450 and adjacent to dummification lines 414A, 414B, 414C, 414D, 414E, 414F, 416A, 416B, 416C, and 416D and interconnect lines 404A, 404B, 404C, 410A, 410B and 410C. In an embodiment, the system 400 further includes a power supply 460 coupled to the transistor 402.

In an embodiment, the underlying substrate 403 represents a surface used to manufacture integrated circuits. Suitable substrate 403 includes a material such as single crystal silicon, polycrystalline silicon and silicon on insulator (SOI), as well as substrates formed of other semiconductor materials. In some embodiments, the substrate 403 is the same as or substantially the same as the substrate 403. The substrate 403 may also include semiconductor materials, metals, dielectrics, dopants, and other materials commonly found in semiconductor substrates.

In an embodiment, the transistors 402 and 408 associated with substrate 403 are metal-oxide-semiconductor field-effect transistors (MOSFET or simply MOS transistors), fabricated on the substrate 403. In some embodiments, the transistors 402 and 408 are access transistors 402 and 408. In various implementations of the disclosure, the transistors 402 and 408 may be planar transistors, nonplanar transistors, or a combination of both. Nonplanar transistors include FinFET transistors such as double-gate transistors and tri-gate transistors, and wrap-around or all-around gate transistors such as nanoribbon or nanowire transistors.

In some embodiments, the gate dielectric layers 418A and 434A include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on gate dielectric layers 418A and 434A to improve its quality when a high-k material is used.

The gate electrodes 418B and 434B of the access transistors 402 and 408, respectively, may include at least one P-type work function metal or N-type work function metal, or both N or P type work function metals, depending on whether the transistors 402 and 408 are to be PMOS, NMOS transistor or an NMOS/PMOS pair. In some implementations, the gate electrodes 418B and 434B include a stack of two or more metal layers, where one or more metal layers are work function metal layers and at least one metal layer is a conductive fill layer.

For a PMOS transistor, metals that may be used for the gate electrodes 418B and/or 434B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.4 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.4 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrodes 418B and/or 434B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrodes 418B and/or 434B may include one or more U-shaped metal layers formed atop one or more planar, non-U-shaped layers.

The sidewall spacers 426 and 440 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source regions 422 and 436 and drain regions 424 and 438 are formed within the substrate 403 adjacent to the gate stack of each MOS transistor 402 and 408, respectively. The source regions 422 and 436 and drain regions 424 and 438 are generally formed using either an implantation/diffusion process or an etching/deposition process. In the former process, dopants such as boron, aluminum, antimony, phosphorous, or arsenic may be ion-implanted into the substrate to form the source regions 422 and 436 and drain regions 424 and 438. An annealing process that activates the dopants and causes them to diffuse further into the substrate typically follows the ion implantation process. In the latter process, the substrate 403 may first be etched to form recesses at the locations of the source and drain regions. An epitaxial deposition process may then be carried out to fill the recesses with material that is used to fabricate the source regions 422 and 436 and drain regions 424 and 438. In some implementations, the source regions 422 and 436 and drain regions 424 and 438 may be fabricated using a silicon alloy such as silicon germanium or silicon carbide. In some implementations, the epitaxially deposited silicon alloy may be doped in situ with dopants such as boron, arsenic, or phosphorous. In further embodiments, the source regions 422 and 436 and drain regions 424 and 438 may be formed using one or more alternate semiconductor materials such as germanium or a group III-V material or alloy. And in further embodiments, one or more layers of metal and/or metal alloys may be used to form the source regions 422 and 436 and drain regions 424 and 438.

In an embodiment, the source contacts 432 and 446, the drain contact 430 and 444 and gate contacts 428 and 442 each include a multi-layer stack. In an embodiment, the multi-layer stack includes one or more of Ti, Ru or Al and a conductive cap on the one or more of Ti, Ta, Ru or Al. The conductive cap may include a material such as W or Cu.

In an embodiment, the source interconnects 404C and 410C, gate interconnects 404A and 410A, and drain interconnects 404B and 410B each include a multi-layer stack. In an embodiment, the multi-layer stack includes one or more of Ti, Ru or Al and a conductive cap on the one or more of Ti, Ta, Ru or Al. The conductive cap may include a material such as W or Cu.

The isolation portions 409A, 409B and 409C and dielectric 448 and 452 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 5:
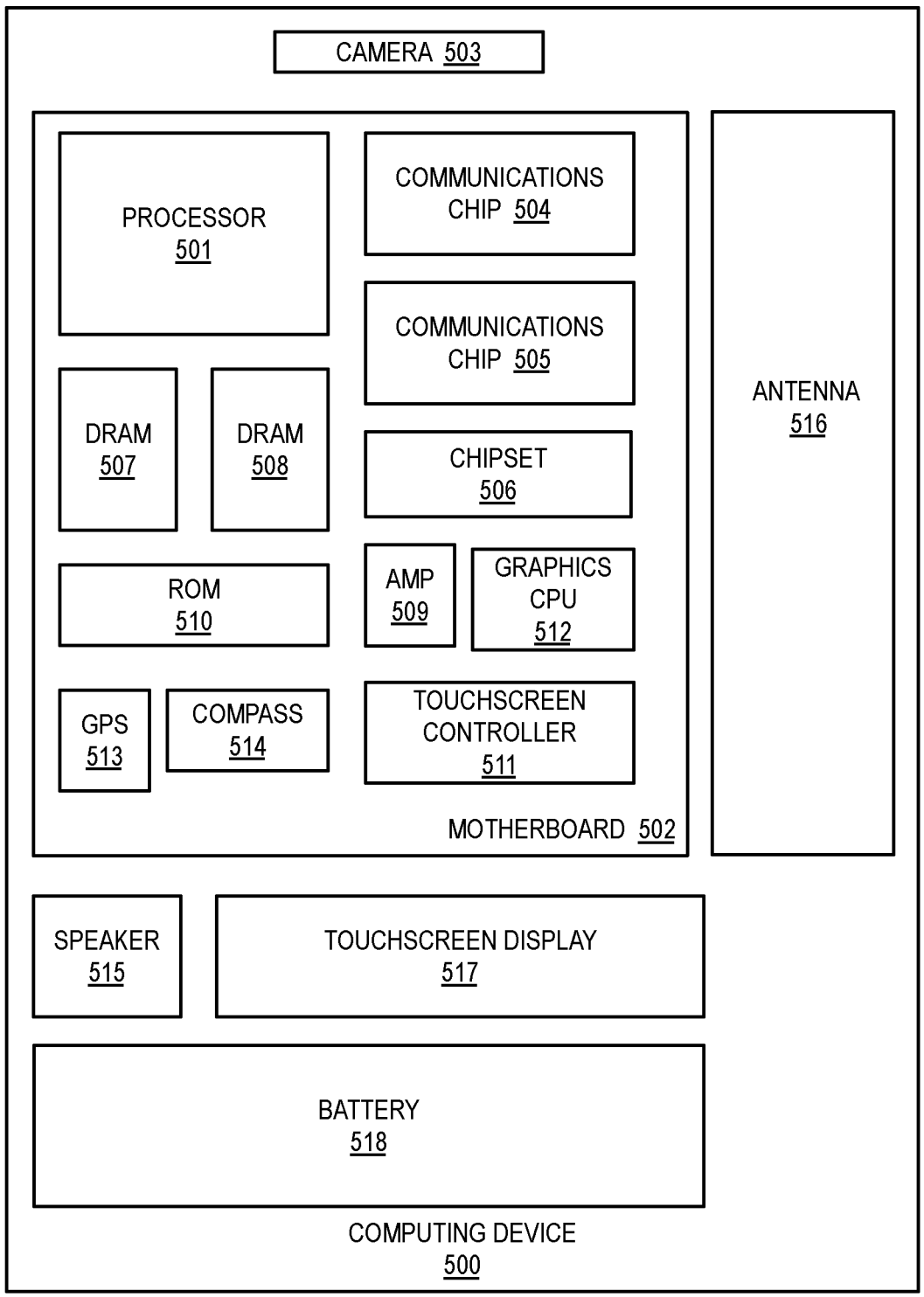
FIG. 5 illustrates a computing device in accordance with embodiments of the present disclosure.

FIG. 5 illustrates a computing device 500 in accordance with embodiments of the present disclosure. As shown, computing device 500 houses a motherboard 502. Motherboard 502 may include a number of components, including but not limited to a processor 501 and at least one communications chip 504 or 505. Processor 501 is physically and electrically coupled to the motherboard 502. In some implementations, communications chip 505 is also physically and electrically coupled to motherboard 502. In further implementations, communications chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 505 may implement any of a number of wireless standards or protocols, including but not limited to $W_i$-Fi (IEEE 501.11 family), WiMAX (IEEE 501.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communications chips 504 and 505. For instance, a first communications chip 505 may be dedicated to shorter range wireless communications such as $W_i$-Fi and Bluetooth and a second communications chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes non-volatile memory devices, device structures and one or more integrated circuit structures such as integrated structures 100 described in association with FIGS. 1A-1C, respectively. Referring again to FIG. 5, the term "processor" may refer to any device or portion of a device that processes electronic data from registers and/or memory to transform that electronic data into other electronic data that may be stored in registers and/or memory.

Communications chip 505 also includes an integrated circuit die packaged within communication chip 505. In another embodiment, the integrated circuit die of communications chips 504, 505 includes one or more interconnect structures, non-volatile memory devices, capacitors. Depending on its applications, computing device 500 may include other components that may or may not be physically and electrically coupled to motherboard 502. These other components may include, but are not limited to, volatile memory (e.g., DRAM) 507, 508, non-volatile memory (e.g., ROM) 510, a graphics CPU 512, flash memory, global positioning system (GPS) device 513, compass 514, a chipset 506, an antenna 516, a power amplifier 509, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of nonvolatile memory devices.

In various implementations, the computing device 500 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
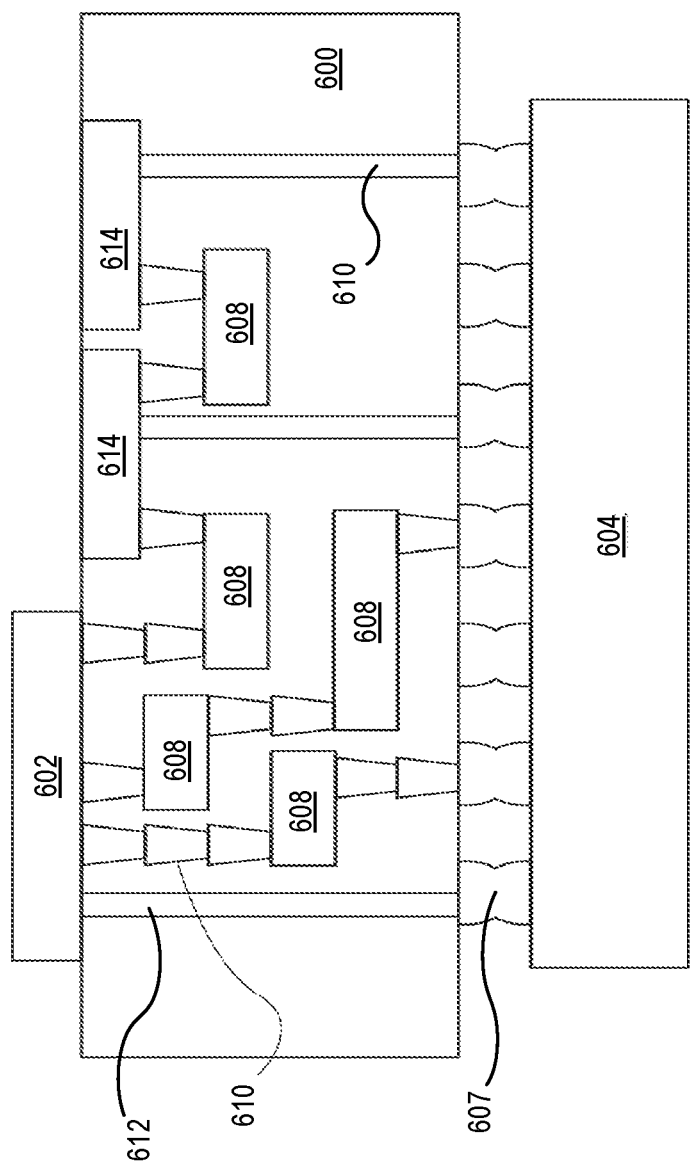
FIG. 6 illustrates an integrated circuit (IC) structure.

FIG. 6 illustrates an integrated circuit (IC) structure 600 that includes one or more embodiments of the disclosure. The integrated circuit (IC) structure 600 is an intervening substrate used to bridge a first substrate 602 to a second substrate 604. The first substrate 602 may be, for instance, an integrated circuit die. The second substrate 604 may be, for instance, a memory module, a computer mother, or another integrated circuit die. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 607 that can subsequently be coupled to the second substrate 604. In some embodiments, the first substrate 602 and the second substrate 604 are attached to opposing sides of the integrated circuit (IC) structure 600. In other embodiments, the first substrate 602 and the second substrate 604 are attached to the same side of the integrated circuit (IC)

structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 608 and vias 610, including but not limited to through-silicon vias (TSVs) 612. The integrated circuit (IC) structure 600 may further include embedded devices 614, including both passive and active devices. Such embedded devices 614 include capacitors, resistors, inductors, fuses, diodes, transformers, device structure including transistors, and integrated circuit structures connected to device structures such as integrated circuit structure 100 described in association with FIGS. 1A-1C, respectively. Referring again to FIG. 6, the integrated circuit (IC) structure 600 may further include embedded devices such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 600.

Example 1: The device structure including an integrated circuit structure including a plurality of interconnect lines and a plurality of dummy lines co-planar with the plurality of interconnect lines, where a ratio of line length to end-to-end spacing of the dummy lines varies inversely with a density of the interconnect lines within each of a plurality of regions that are of approximately equal area within a rectangular grid array.

Example 2: The device structure according to example 1, where individual ones of the interconnect lines have a width and an interconnect length along a longitudinal direction, and where the density of the interconnect lines is a product of the interconnect length and the width of all interconnect lines within a rectangular grid divided by an area of the rectangular grid, where individual ones of the dummy lines have a width and a dummy line length along a longitudinal direction and wherein the density of the dummy lines is a product of the dummy line length and the width of all dummy lines within a rectangular grid divided by an area of the rectangular grid.

Example 3: The device structure according to any of one examples 1 through 2, wherein a combined sum of the density of the interconnect lines and the density of the dummy lines in the individual ones of the plurality of regions is less than 70%.

Example 4: The device structure according to any of one examples 1 through 3, where the rectangular grid array comprises a first region comprising a first plurality of interconnect lines having a first density and where individual ones of the first plurality of interconnect lines are separated by a first distance measured along a direction orthogonal to the longitudinal direction.

Example 5: The device structure according to any of one examples 1 through 4, where the rectangular grid array includes a second region adjacent to the first region, the second region including a second plurality of interconnect lines having a second density, and a first plurality of dummy lines, where the individual ones of a first plurality of dummy lines are longitudinally aligned with one or more of the first plurality of interconnect lines, and where a first end of one or more of the first plurality of dummy lines are further aligned with a first end of the second plurality of interconnect lines along a direction orthogonal to the longitudinal direction.

Example 6: The device structure according to any of one examples 1 through 5, where the second region further includes an end portion of the individual ones of the first plurality of interconnect lines, where one or more of the first plurality of interconnect lines are longitudinally aligned with a respective individual ones of the second plurality of interconnect lines, and where the end portion of the individual ones of the first plurality of interconnect lines are laterally spaced apart from one or more of the first plurality of dummy lines and from the second plurality of interconnect lines by a spacing.

Example 7: The device structure according to any of one examples 1 through 6, the first plurality of dummy lines includes a first ratio of line length to end-to-end spacing, where the first ratio is approximately 1:1.

Example 8: The device structure according to any of one examples 1 through 7, where a combined sum of the density of the interconnect lines and the density of the dummy lines in the second region is within 30% of the combined sum of the density of the interconnect lines and the density of the dummy lines in the first region.

Example 9: The device structure according to any of one examples 1 through 8, where the rectangular grid array includes a third region adjacent to the second region, the third region including a third plurality of interconnect lines having a third density, the third density less than the second density, and a second plurality of dummy lines, where a first end of one or more of the second plurality of dummy lines are aligned with a first end of one or more of the third plurality of interconnect lines along a direction orthogonal to the longitudinal direction.

Example 10: The device structure according to any of one examples 1 through 9, where the second plurality of dummy lines include a second ratio of line length to end-to-end spacing, where the second ratio is approximately 2:1.

Example 11: The device structure according to any of one examples 1 through 10, where the third line density is less than the second line density by at least 80%.

Example 12: The device structure according to any of one examples 1 through 11, where individual ones of the first plurality of interconnect lines, the second plurality of interconnect lines and the third plurality of interconnect lines each include at least one via.

Example 13: The device structure according to any of one examples 1 through 12, where a combined sum of the density of the interconnect lines and the density of the dummy lines in the third region is within 30% of the combined sum of the density of the interconnect lines and the density of the dummy lines in the first region and within 10% of the combined sum of the density of the interconnect lines and the density of the dummy lines in the second region Example 14: A method to control line density in an integrated circuit layout includes inputting a design for an integrated circuit structure layout into a density calculation program, identifying and converting a plurality of redundant metal lines in the integrated circuit structure layout to a plurality of preliminary dummy lines, grouping the plurality of preliminary dummy lines, splitting the integrated circuit structure layout into regions and determining a line density in each region and calculating lengths of each dummification lines and space between each dummification lines within each region.

Example 15: The method according to example 14, where identifying and converting a plurality of redundant metal lines in the integrated circuit structure layout further includes cleaving off portions of individual ones of the metal lines into an active metal line and a preliminary dummy line.

Example 16: The method according to any of one examples 15, where grouping all preliminary dummy lines further includes grouping preliminary dummy lines that are not part of metal lines.

Example 17: The method according to any of one examples 16, where splitting the integrated circuit structure layout into regions comprises dividing the layout into regions having an approximately same area, and determining a line density in each region comprises computing an area of all active metal lines.

Example 18: The method according to any of one examples 17, where calculating lengths of each dummification lines and space between each dummification lines includes assigning a numerical ratio of a dummification line length to end-end spacing between adjacent dummification lines.

Example 19: A system includes a processor and an integrated circuit structure. The integrated circuit structure includes a plurality of interconnect lines, a plurality of dummy lines co-planar with the plurality of interconnect lines, where a ratio of line length to end-to-end spacing of the dummy lines varies inversely with a density of the interconnect lines within each of a plurality of regions of approximately equal area within a rectangular grid array and a plurality of transistors where a first one or more of the plurality of transistors is coupled with one or more interconnect lines in a first region and a second one or more of the plurality of transistors is coupled with one or more interconnect lines in a second region.

Example 20: The device structure according to example 19, where a density of interconnect lines in the first region is approximately equal to a density of interconnect lines in the second region.

A density control method for capacitance reduction during mask design is described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit structure comprising:
a plurality of interconnect lines; and
a plurality of dummy lines co-planar with the plurality of interconnect lines, wherein a ratio of line length to end-to-end spacing of the dummy lines varies inversely with a density of the interconnect lines within each of a plurality of regions of approximately equal area within a rectangular grid array.

2. The integrated circuit structure of claim 1, wherein individual ones of the interconnect lines have a width and an interconnect length along a longitudinal direction, and wherein the density of the interconnect lines is a product of the interconnect length and the width of all interconnect lines within a rectangular grid divided by an area of the rectangular grid, wherein individual ones of the dummy lines have a width and a dummy line length along a longitudinal direction and wherein the density of the dummy lines is a product of the dummy line length and the width of all dummy lines within a rectangular grid divided by an area of the rectangular grid.

3. The integrated circuit structure of claim 2, wherein a combined sum of the density of the interconnect lines and the density of the dummy lines in the individual ones of the plurality of regions is less than 70%.

4. The integrated circuit structure of claim 2, wherein the rectangular grid array comprises a
a first region comprising a first plurality of interconnect lines having a first density, wherein individual ones of the first plurality of interconnect lines are separated by a first distance measured along a direction orthogonal to the longitudinal direction.

5. The integrated circuit structure of claim 4, wherein the rectangular grid array comprises a second region adjacent to the first region, the second region comprising:
a second plurality of interconnect lines having a second density,
a first plurality of dummy lines, wherein the individual ones of a first plurality of dummy lines are longitudinally aligned with one or more of the first plurality of interconnect lines, and wherein a first end of one or more of the first plurality of dummy lines are further aligned with a first end of the second plurality of interconnect lines along a direction orthogonal to the longitudinal direction.

6. The integrated circuit structure of claim 5, wherein the second region further comprises an end portion of the individual ones of the first plurality of interconnect lines, wherein one or more of the first plurality of interconnect lines are longitudinally aligned with a respective individual ones of the second plurality of interconnect lines, and wherein the end portion of the individual ones of the first plurality of interconnect lines are laterally spaced apart from one or more of the first plurality of dummy lines and from the second plurality of interconnect lines by a spacing.

7. The integrated circuit structure of claim 5, the first plurality of dummy lines comprise a first ratio of line length to end-to-end spacing, wherein the first ratio is approximately 1:1.

8. The integrated circuit structure of claim 5, wherein a combined sum of the density of the interconnect lines and the density of the dummy lines in the second region is within 30% of the combined sum of the density of the interconnect lines and the density of the dummy lines in the first region.

9. The integrated circuit structure of claim 5, wherein the rectangular grid array comprises a third region adjacent to the second region, the third region comprising:
a third plurality of interconnect lines having a third density, the third density less than the second density, and
a second plurality of dummy lines, wherein a first end of one or more of the second plurality of dummy lines are aligned with a first end of one or more of the third plurality of interconnect lines along a direction orthogonal to the longitudinal direction.

10. The integrated circuit structure of claim 9, the second plurality of dummy lines comprise a second ratio of line length to end-to-end spacing, wherein the second ratio is approximately 2:1.

11. The integrated circuit structure of claim 9, wherein the third line density is less than the second density by at least 80 percent.

12. The integrated circuit structure of claim 9, wherein individual ones of the first plurality of interconnect lines, the second plurality of interconnect lines and the third plurality of interconnect lines each comprise at least one via.

13. The integrated circuit structure of claim 9, wherein a combined sum of the density of the interconnect lines and the density of the dummy lines in the third region is within 30% of the combined sum of the density of the interconnect lines and the density of the dummy lines in the first region and within 10% of the combined sum of the density of the interconnect lines and the density of the dummy lines in the second region.

14. A system comprising:
a processor; and
an integrated circuit structure comprising:
   a plurality of interconnect lines;
   a plurality of dummy lines co-planar with the plurality of interconnect lines, wherein a ratio of line length to end-to-end spacing of the dummy lines varies inversely with a density of the interconnect lines within each of a plurality of regions of approximately equal area within a rectangular grid array; and
   a plurality of transistors wherein a first one or more of the plurality of transistors is coupled with one or more interconnect lines in a first region and a second one or more of the plurality of transistors is coupled with one or more interconnect lines in a second region.

15. The system of claim 14, wherein a density of interconnect lines in the first region is approximately equal to a density of interconnect lines in the second region.

* * * * *